(12) United States Patent
Troy (10) Patent No.: US 6,351,102 B1
(45) Date of Patent: Feb. 26, 2002

(54) AUTOMOTIVE BATTERY CHARGING SYSTEM TESTER

(75) Inventor: Michael E. Troy, Lockport, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/293,020

(22) Filed: Apr. 16, 1999

(51) Int. Cl.[7] .................................................. H02J 7/16
(52) U.S. Cl. ...................................... 320/139; 320/137
(58) Field of Search ................................. 320/139, 137, 320/125, 161; 324/426, 427, 430, 434

(56) References Cited

U.S. PATENT DOCUMENTS

| | | | |
|---|---|---|---|
| 2,514,745 A | 7/1950 | Dalzell | 324/115 |
| 3,356,936 A | 12/1967 | Smith | 324/429 |
| 3,562,634 A | 2/1971 | Latner | 324/427 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 98/58270 | 12/1998 |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

(List continued on next page.)

*Primary Examiner*—Peter S. Wong
*Assistant Examiner*—Lawrence Luk
(74) *Attorney, Agent, or Firm*—Westman, Champlin & Kelly, P.A.

(57) ABSTRACT

An automotive battery charging system tester for testing the charging system of an automotive vehicle includes AC and DC voltage measurement circuits and a microprocessor controlled testing sequence. The microprocessor is used to perform a series of tests and to instruct an operator to perform steps associated with performing those tests. Through the application of various loads at various engine speeds, the tester is capable of identifying faults in the battery charging system including a bad battery, problems in the alternator or associated electronics, and problems in the starting system.

123 Claims, 8 Drawing Sheets

U.S. PATENT DOCUMENTS

| | | | |
|---|---|---|---|
| 3,593,099 A | 7/1971 | Scholl | 320/127 |
| 3,607,673 A | 9/1971 | Seyl | 324/425 |
| 3,676,770 A | 7/1972 | Sharaf et al. | 324/430 |
| 3,729,989 A | 5/1973 | Little | 324/162 |
| 3,753,094 A | 8/1973 | Furuishi et al. | 324/430 |
| 3,808,522 A | 4/1974 | Sharaf | 324/430 |
| 3,811,089 A | 5/1974 | Strzelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/163 |
| 3,947,757 A | 3/1976 | Grube et al. | 327/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,024,953 A | 5/1977 | Nailor, III | 206/344 |
| 4,053,824 A | 10/1977 | Dupuis et al. | 324/434 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 324/429 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 324/503 |
| 4,217,645 A | 8/1980 | Barry et al. | 702/63 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,363,407 A | 12/1982 | Barkler et al. | 209/3.3 |
| 4,369,407 A | 1/1983 | Korbell | 324/416 |
| 4,379,990 A | 4/1983 | Sievers et al. | 322/99 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,633,418 A | 12/1986 | Bishop | 320/136 |
| 4,659,977 A | 4/1987 | Kissel et al. | 320/64 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,697,134 A | 9/1987 | Burkum et al. | 320/134 |
| 4,707,795 A | 11/1987 | Alber et al. | 324/433 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,756 A | 3/1989 | Fox | 324/766 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavvvvey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,047,722 A | 9/1991 | Wurst et al. | 324/430 |
| 5,087,881 A | 2/1992 | Peacock | 324/378 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,315,287 A * | 5/1994 | Sol | 302/DIG. 21 |
| 5,321,626 A | 6/1994 | Palladino | 324/432 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |
| 5,365,453 A | 11/1994 | Startup et al. | 320/136 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/160 |
| 5,434,495 A | 7/1995 | Toko | 320/135 |
| 5,442,274 A | 8/1995 | Tamai | 320/146 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,457,377 A | 10/1995 | Jonsson | 324/430 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A * | 11/1996 | McShane et al. | 320/161 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,596,260 A | 1/1997 | Moravec et al. | 320/135 |

| | | | |
|---|---|---|---|
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,621,298 A | 4/1997 | Harvey | 320/134 |
| 5,642,031 A | 6/1997 | Brotto | 320/156 |
| 5,650,937 A | 7/1997 | Bounaga | 324/426 |
| 5,652,501 A | 7/1997 | McClure et al. | 320/118 |
| 5,656,920 A | 8/1997 | Cherng et al. | 320/161 |
| 5,675,234 A | 10/1997 | Greene | 320/DIG. 18 |
| 5,677,077 A | 10/1997 | Faulk | 429/90 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,710,503 A | 1/1998 | Sideris et al. | 320/6 |
| 5,717,336 A | 2/1998 | Basell et al. | 324/430 |
| 5,717,937 A | 2/1998 | Fritz | 395/750.01 |
| 5,747,909 A | 5/1998 | Syverson et al. | 310/156 |
| 5,757,192 A | 5/1998 | McShane et al. | 324/427 |
| 5,760,587 A * | 6/1998 | Harvey | 324/434 |
| 5,773,978 A | 6/1998 | Becker | 324/430 |
| 5,789,899 A | 8/1998 | van Phuoc et al. | 320/112 |
| 5,793,359 A | 8/1998 | Ushikubo | 345/169 |
| 5,808,469 A | 9/1998 | Kopera | 324/434 |
| 5,821,756 A | 10/1998 | McShane et al. | 324/430 |
| 5,825,174 A | 10/1998 | Parker | 324/106 |
| 5,831,435 A * | 11/1998 | Troy | 324/426 |
| 5,862,515 A | 1/1999 | Kobayashi et al. | 702/63 |
| 5,872,443 A | 2/1999 | Williamson | 320/160 |
| 5,895,440 A | 4/1999 | Proctor et al. | 702/63 |
| 5,914,605 A | 6/1999 | Bertness | 324/430 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A * | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A * | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,150,793 A | 11/2000 | Lesesky et al. | 320/104 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,250,973 B1 | 6/2001 | Lowrey et al. | 439/763 |
| 6,254,438 B1 | 7/2001 | Gaunt | 439/755 |
| 6,304,087 B1 | 10/2001 | Bertness | 324/426 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |

OTHER PUBLICATIONS

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

* cited by examiner

AUTOMOTIVE BATTERY CHARGING SYSTEM TESTER

BACKGROUND OF THE INVENTION

The present invention relates to devices for testing an automotive vehicle. More specifically, the present invention relates to a battery charging system tester for an automotive vehicle.

Automotive vehicles include a storage battery for operating electronics in the vehicle and using an electric starter to start the vehicle engine. A battery charging system is coupled to the engine and is powered by the engine when the vehicle is running. The charging system is used to charge the storage battery when the vehicle is operating.

Many attempts have been made to test the battery of the vehicle. One technique which has been pioneered by Dr. Keith S. Champlin and Midtronics, Inc. of Burr Ridge, Ill. relates to measuring the conductance of batteries to determine their condition. This technique is described in a number of United States patents, for example, U.S. Patent Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; and U.S. Pat. No. 5,831,435, issued Nov. 3, 1998, entitled BATTERY TESTER FOR JIS STANDARD.

With the advent of accurate battery testing, it has become apparent that in some instances the battery in the vehicle may be good, and a problem related to the battery charging system is the cause of the perceived battery failure. A vehicle charging system generally includes the battery, an alternator, a regulator and an alternator drive belt. In most modern vehicles, the regulator is built into the alternator housing and is referred to as an internal regulator. The role of the charging system is two fold. First, the alternator provides charging current for the battery. This charging current ensures that the battery remains charged while the vehicle is being driven and therefore will have sufficient capacity to subsequently start the engine. Second, the alternator provides an output current for all of the vehicle electrical loads. In general, the alternator output, the battery capacity, the starter draw and the vehicle electrical load requirements are matched to each other for optimal performance. In a properly functioning charging system, the alternator will be capable of outputting enough current to drive the vehicle electrical loads while simultaneously charging the battery. Typically, alternators range in size from 60 to 120 amps.

A number of charging system testers have been used to evaluate the performance of the vehicle charging system. These testers generally use an inductive "amp clamp." The amp clamp is placed around a cable or wire and inductively couples to the cable or wire such that the current passing through the wire can be measured. This measurement can be made without having to disconnect the wire. In such a system, typically the operator determines the rated size of the alternator. Next, the operator connects the amp clamp to the output cable of the alternator and an electrical load such as a carbon pile load tester, is placed across the battery. This is a large resistive load capable of receiving several hundred amps which will force the alternator to provide its maximum output. The maximum output current can then be measured using the amp clamp connection. If the measured output is less than the rated output, the alternator is determined to be malfunctioning. Such a test is cumbersome as the equipment is large and difficult to handle. Further, it is difficult, particularly with compact engines, to reach the alternator output cable. Further, in some cases, the amp clamp may not fit around the output cable. It is also very easy to place the amp clamp around the wrong cable causing a false test.

Another testing technique is described in U.S. Pat. No. 4,207,611, which issued Jun. 10, 1980 and is entitled APPARATUS AND METHOD FOR CALIBRATED TESTING OF A VEHICLE ELECTRICAL SYSTEM. The device described in this reference monitors voltage changes present at the cigarette lighter of an automotive vehicle in order to determine the condition of the alternator by applying internal loads such as head lamps and blowers, while the engine is running.

SUMMARY OF THE INVENTION

The present invention includes an automotive battery charging system tester for testing the charging system of an automotive vehicle. The tester includes AC and DC voltage measurement circuits and a microprocessor controlled testing sequence. The microprocessor is used to perform a series of tests and instruct an operator to perform steps associated with those tests. Through the application of various loads at various engine speeds, the tester is capable of identifying faults in the battery charging system including a bad battery, problems in the alternator or associated electronics, and problems in the starting system.

DETAILED DESCRIPTION OF THE PREFERRED EMBODIMENTS

Figure 1:
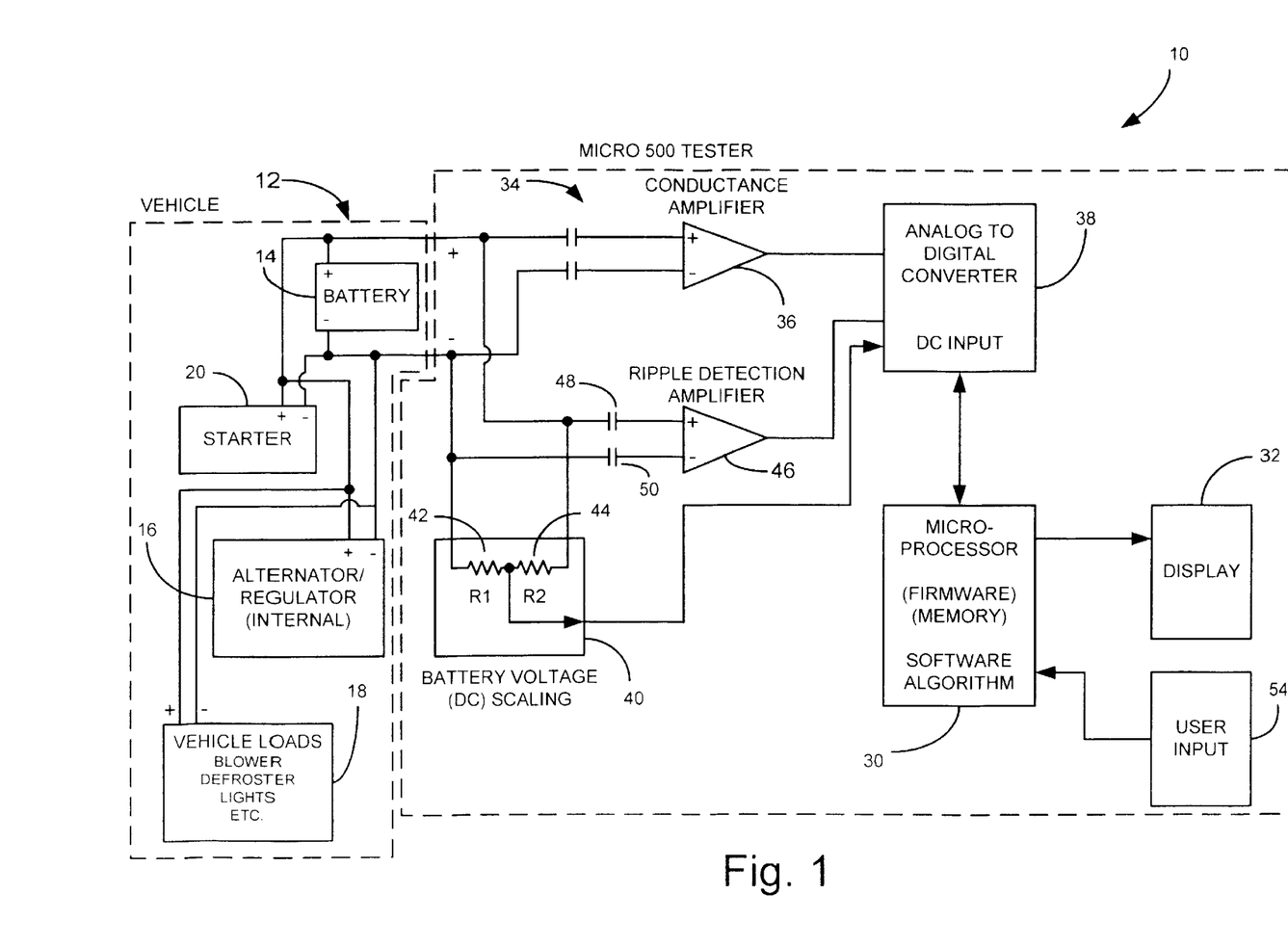
FIG. 1 is a simplified block diagram of an automotive battery charging system tester in accordance with the present invention.

FIG. 1 is a simplified block diagram of a battery charging system tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 36. Section 34 operates in accordance with, for example, the conductance based battery testing techniques described in Champlin patents U.S. Pat. Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,598,098, issued Jan. 28, 1997, entitled ELECTRONIC BATTERY TESTER WITH VERY HIGH NOISE IMMUNITY; U.S. Pat. No. 5,821,756, issued Oct. 13, 1998, entitled ELECTRONIC BATTERY TESTER WITH TAILORED COMPENSATION FOR LOW STATE-OF-CHARGE. Section 34 is illustrated in very simplified form and conductance amplifier 36 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

Figure 2:
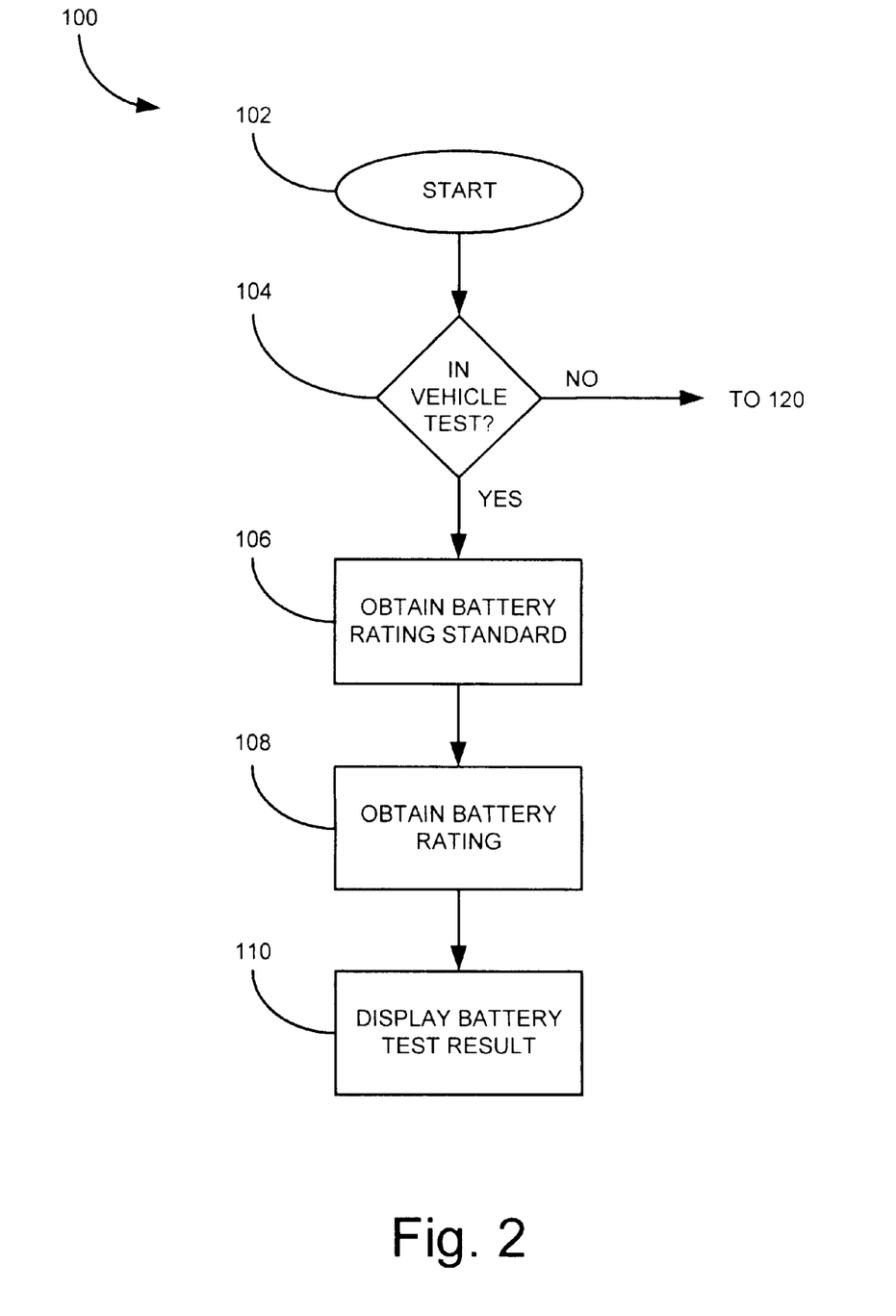
FIG. 2 is a simplified flow chart showing steps in a battery test.

FIGS. 2–8 are simplified block diagrams illustrating steps in accordance with the invention. User input for the steps can be through user input device 54 and a display can be provided through display device 32. In FIG. 2, block diagram 100 begins at start block 102. At block 104 the type of vehicle test is selected. If it is an in-vehicle test, control is passed to block 106. If it is an out of vehicle test, control is passed to block 120. At block 106, the user is prompted to input the battery rating standard to be used for the test. Various standards include SAE, DIN, IEC, EN, JIS or a battery stock number. At block 108, the user is prompted to input the battery rating according to the selected standard. A battery test is then performed at block 110, the results of the battery test are displayed including battery voltage, battery cold cranking amps, and a general condition of the battery such as good, good but recharge, charged and retest, replace battery or bad cell-replace. Any type of battery test may be used, however, conductance, resistance, impedance or admittance based testing as described in the Champlin and Midtronics patents is preferred.

Figure 3:
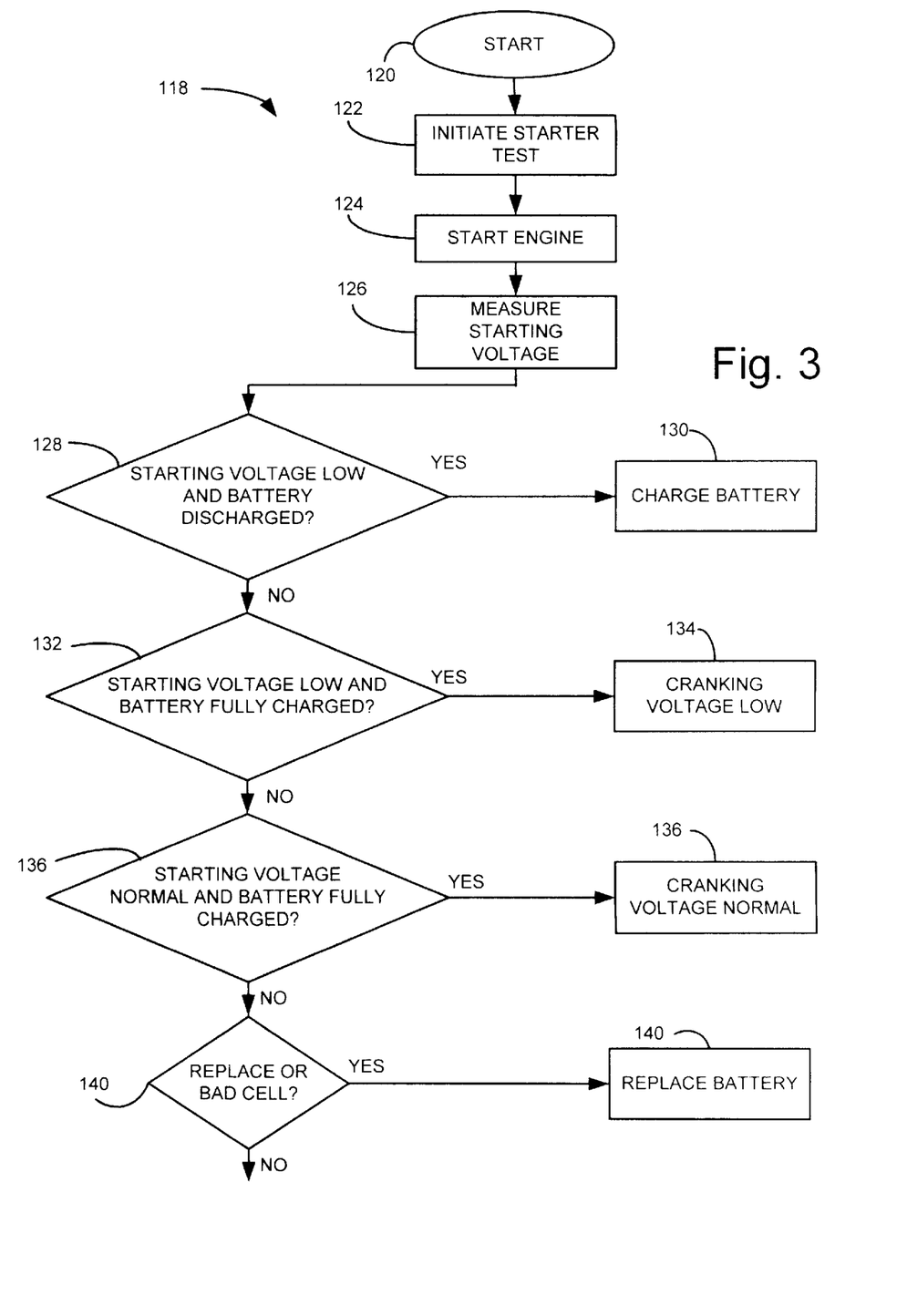
FIG. 3 is a simplified flow chart showing steps in a starter test.

FIG. 3 is a simplified block diagram 118 for an in-vehicle test. When the user initiates a starter test, for example through an input through user input 54, control is passed to block 124 and the operator is instructed to start the engine. Microprocessor 30 detects that the engine is being started by monitoring the resultant in drop in voltage across battery 14. The starting voltage is measured at block 126. Once the engine starts, and the voltage begins to rise, the tester 10 will display one of four different test results. At block 128, if the starting voltage is low and the battery is discharged, the message "charge battery" is displayed at block 130. At block 132, if the starting voltage is low and the battery has a full charge, the message "cranking voltage low" is displayed at block 134 along with the measured voltage. If at block 136, the starting voltage is normal and the battery has a full charge, block 138 displays cranking voltage normal along with the measured voltage. If, at block 140, the battery test result was either replaced or bad cell, block 142 displays the message replace battery. The low and normal cranking voltages can be selected as desired and using known techniques.

Figure 4:
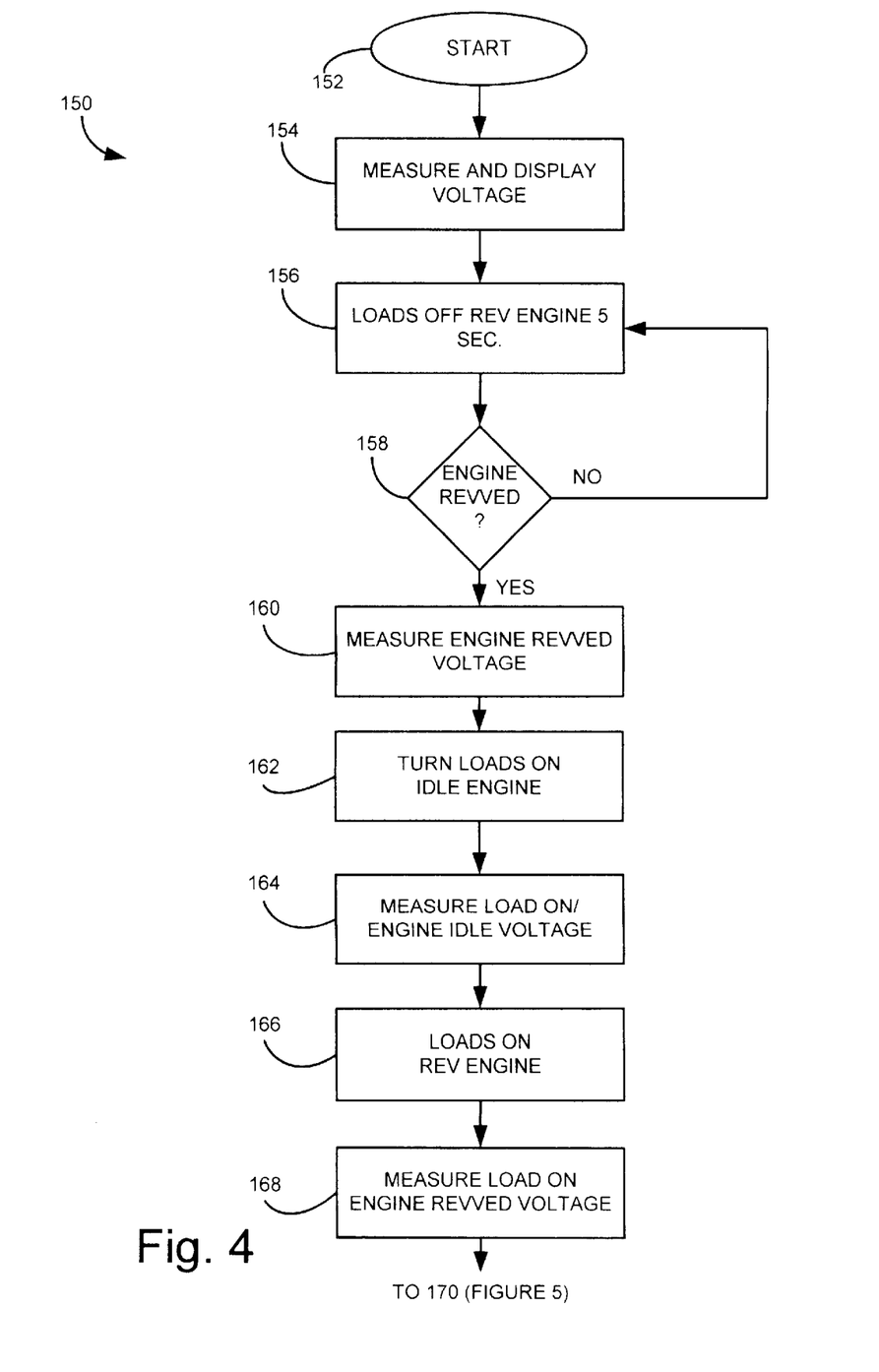
FIG. 4 is a simplified flow chart showing steps in a charging system test.
Figure 5:
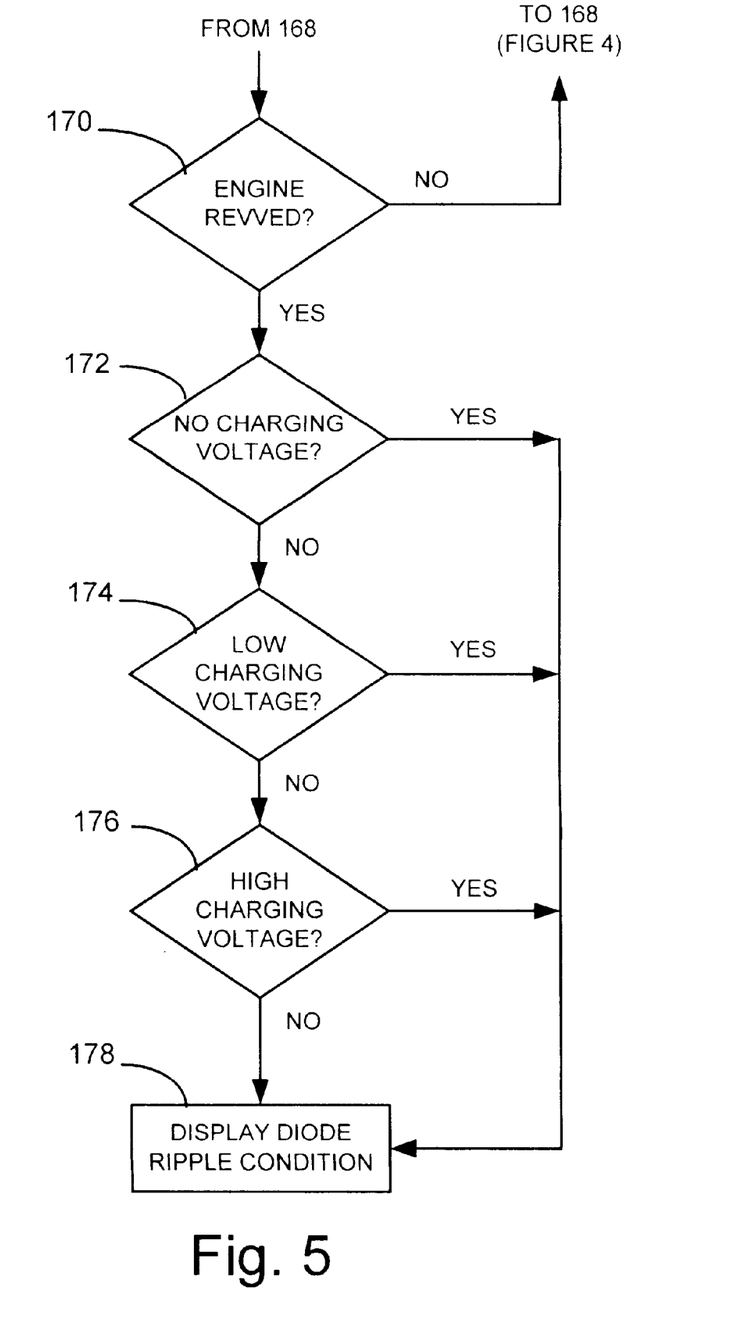
FIG. 5 is a simplified flow chart showing further steps in the charging system test of FIG. 4.

FIG. 4 is a block diagram 150 which illustrates steps in a charging system test in accordance with another aspect of the invention. At block 152, the procedure is initiated by the operator while the engine in vehicle 12 is running. At block 154, the voltage across battery 14 due to alternator 16 is measured and displayed. The operator may press and enter button on user input 54 to continue operation and at block 156 the operator is instructed to turn off all vehicle loads and rev the engine for 5 seconds. At block 158, the revving of the engine is detected by monitoring the AC ripple across battery 14 using ripple detection amplifier 46. If, after 30 seconds, microprocessor 30 does not detect engine revving, control is returned to block 156 and the procedure is repeated. At block 160, the engine revved voltage is measured and control is passed to block 162 where the operator is instructed to turn loads within the vehicle (i.e., headlights, fans, etc.) on and idle the engine. Again, an enter key on user input 54 is pressed and control is passed to block 164 and tester 10 measures the load on, engine idle voltage. At 166, the user is instructed to rev the engine with the loads on and another voltage is obtained at block 168. Control is then passed to block 170 in FIG. 5 and it is determined whether the engine speed has increased. At block 172, if there is no charging voltage, that is i.e., the charging voltage is less than or the same as the idle voltage, an output is displayed. Similarly, if the charging voltage is low such that the total voltage across the battery is less than, for example, 13 volts, an output is displayed. At block 176, if a high charging voltage is detected, such as more than 2.5 volts above the steady state voltage, an output is displayed. When control reaches block 178, an output is provided indicative of the diode ripple voltage. This voltage can be obtained during any of the measurements where the engine is revved. If the ripple voltage is greater than, for example, 130 mV, an indication is provided that there is a diode or a stator problem.

Figure 6:
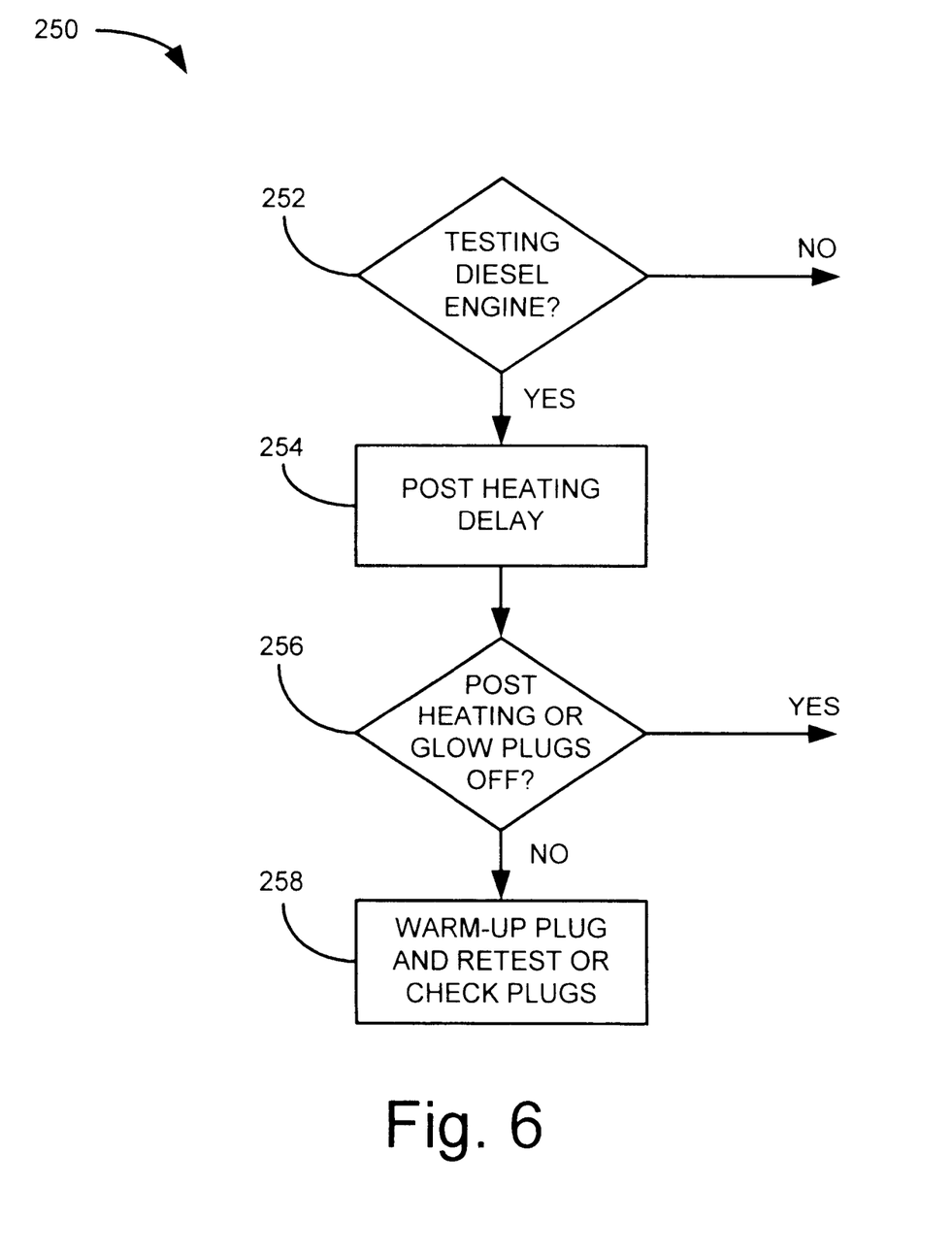
FIG. 6 is a simplified flow chart showing steps in a diesel engine charging system test.

FIG. 6 is a block diagram of a diesel test algorithm 250. If the tester 10 does not detect a charging or a ripple voltage, the tester begins the diesel test algorithm shown at 250. This allows the glow plugs of a diesel engine to turn off. If, at any time during the procedure, a charging voltage and a ripple are detected, the normal test procedure will resume. At block 252, the user is asked to input information as to whether the engine under test is a diesel engine. If the engine is not a diesel engine, a charging system problem is indicated. If the engine is diesel, control is passed to block 254 and a post heating delay, such as 40 seconds, passes at block 256, if there is a post heating or glow plugs off condition, then a charging system problem is indicated. If there is a post heating or glow plug on condition, the operator is instructed to warm up the plugs and retest, or check the glow plugs.

Additionally, the tester 10 can receive a temperature input from the operator and adjust the battery test appropriately.

If the battery test indicates that the battery may have been charged before testing, the user is prompted to indicate whether the test is being performed before charging the battery or after charging the battery and the system is retested.

Figure 7:
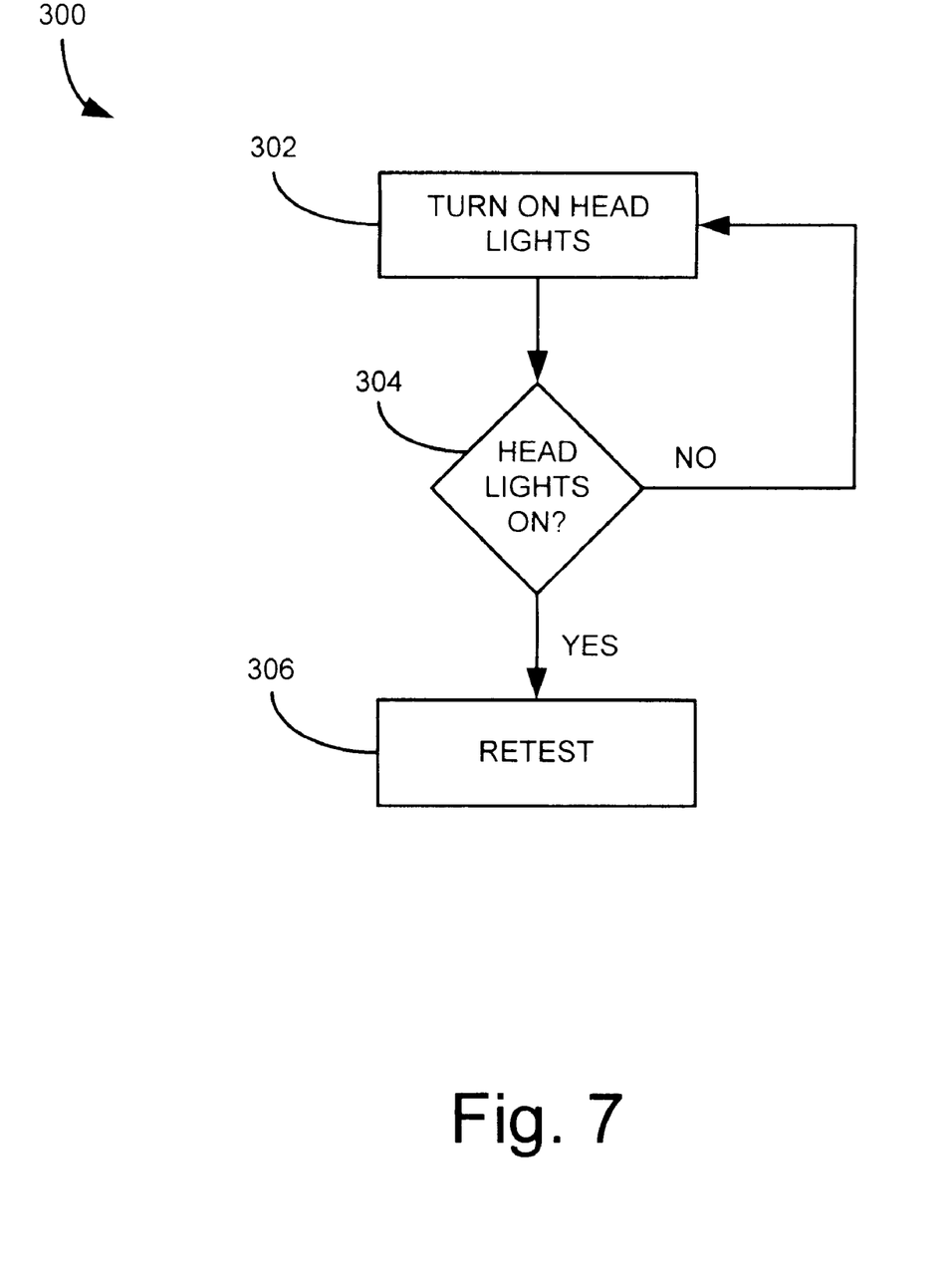
FIG. 7 is a simplified flow chart showing steps to remove surface charge.
Figure 8:
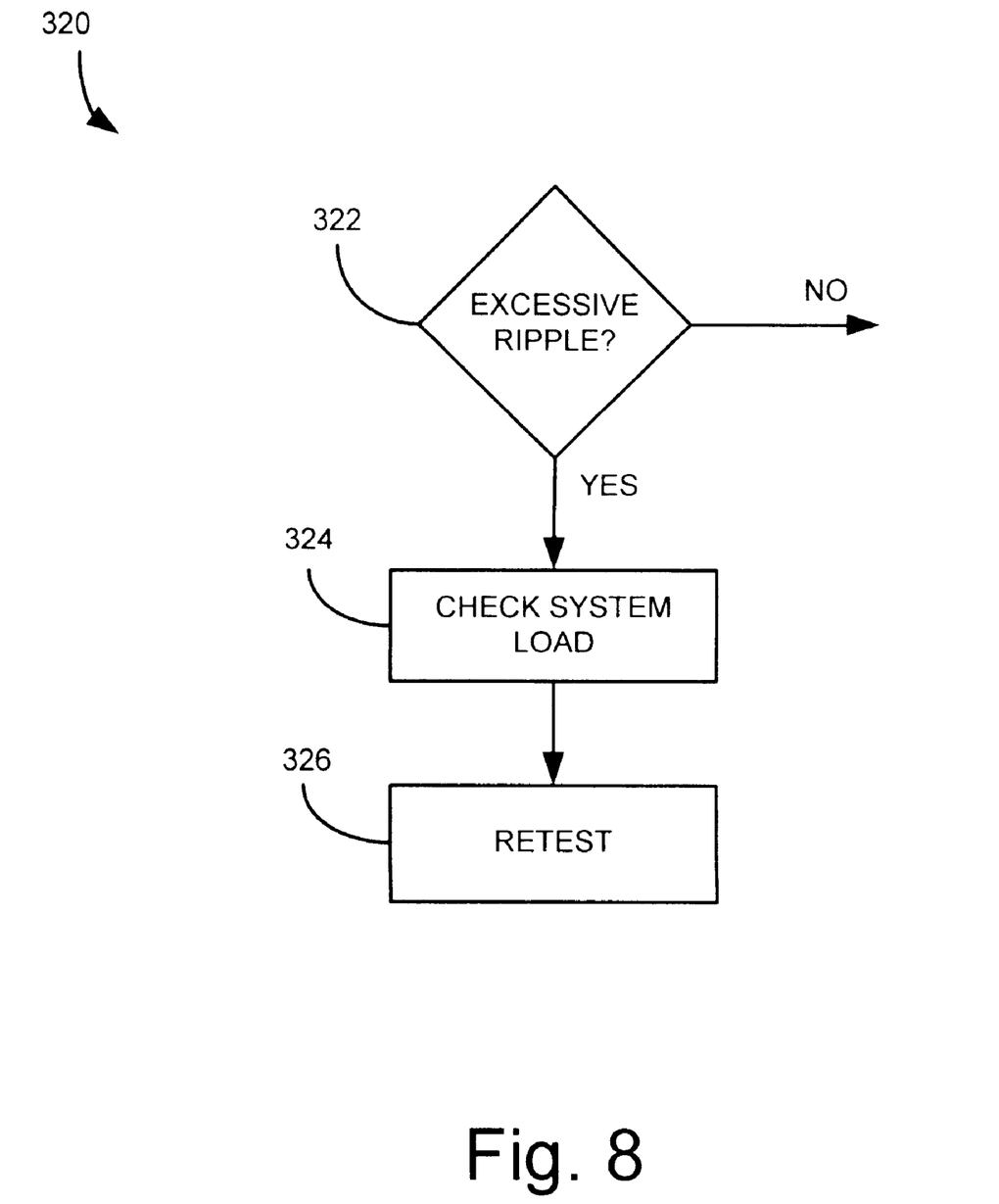
FIG. 8 is a simplified flow chart showing a ripple test.

If the tester 10 determines that the battery may have surface charge, the operator is instructed to turn on the vehicle head lights as indicated in flow chart 300 at block 302. If a drop in voltage is detected at block 304 indicating that the head lights have been turned on, control is passed to block 306. If, however, the head lights have not been turned on, control is returned to block 302. At block 306, the system is retested. Flow chart 320 of FIG. 8 shows a noise detection algorithm. If excessive ripple is detected during engine idle periods at block 322, the operator is instructed to check system loads at block 324. At block 326, the system is retested.

Based upon the test, an output can be printed or otherwise provided to an operator indicating the results of the battery test, the battery rating, the actual measured battery capacity, the voltage, the voltage during cranking and whether the cranking voltage is normal, the condition of the charging system along with the idle voltage and the load voltage and the presence of excessive diode ripple.

In general, the present invention provides the integration of an alternator test with a battery test, an alternator test with a starter test, a starter test with an battery test, or an alternator test with a battery test and with a starter test. The invention allows information from any of these tests to be shared with the other test(s).

In one aspect, tester 10 measures the voltage across battery 14. Both the AC and DC voltages are recorded. The AC voltage is used to identify alternator diode and stator faults. The DC voltage measurement is used to determine if the charging system is functioning properly. The electrical loads of the vehicle are used to load the alternator for convenience. However, other types of loads can also be applied. The tester continually monitors the charging voltage across the battery. The operator is instructed to turn on vehicle loads and rev the engine. The charging voltage is recorded with the engine revved. In a properly functioning charging system, this charging voltage should be greater than the measured battery voltage with the engine off. This indicates that current is flowing into the battery and thus the battery is being charged even with loads applied to the charging system. This testing principle does not require knowledge of the alternator size, or even the amount of current that the alternator is producing. In the testing, various DC voltages across the battery are measured including battery voltage with the engine off (stead state voltage), battery voltage with the engine running at idle (idle voltage), battery voltage with the engine revved, for example between 1,000 RPM and 2,500 RPM, and the vehicle loads off and battery voltage with the engine revved and vehicle loads on. The AC voltage across the battery which is measured with the engine running is used to detect excessive ripple which may be caused by a faulty diode or stator. Ripple of over about 130 mV is indicative of a diode or stator problem. Additionally, the ripple can be used by tester 10 to detect changes in engine RPM.

An initial revving of the engine can be used prior to returning to idle to ensure that the alternator field circuit is excited and conducting current. If the idle voltage with the loads off is less than or equal to the steady state voltage, then a charging problem exists. If the charging voltage exceeds the steady state voltage by more than, for example, 0.5 volts, then a regulator problem is indicated.

With the engine revved and the vehicle loads (such as head lights, blower, rear defrost, etc.) turned on, the revved and loaded voltage across the battery is recorded and compared to the steady state battery voltage. If the charging voltage with loads turned on while the engine is revved is not greater than the steady state voltage, then current is not flowing into the battery and the battery is not being charge. This indicates a problem and that the alternator cannot meet the needs of the vehicle while still charging the battery.

With the present invention, the battery test can be used to prevent incorrectly identifying the charging system as being faulty. Thus, the battery test ensures that a good battery is being charged during the charging system test. The measurement of the cranking voltage while the engine is being started is used to determine whether there is a starter problem. In diesel engine applications, the charging system voltage is measured to determine if the engine glow plug operation is effecting the charging system test result. A long cabling (i.e., 10 to 15 feet) can be used such that the tester 10 can be operated while sitting in the vehicle. The battery testing is preferably performed by measuring the conductance, impedance, resistance or admittance of the battery. Further, the battery test with the engine off can be compared with the battery test with the engine on and used to diagnosis the system.

Although the present invention has been described with reference to preferred embodiments, workers skilled in the art will recognize that changes may be made in form and detail without departing from the spirit and scope of the invention.

What is claimed is:

1. A charging system tester adapted to be electrically coupled to a battery of a vehicle containing a charging system and an engine, comprising:
    voltage measurement circuitry adapted to measure a voltage across the battery;
    a microprocessor adapted to obtain voltage measurements from the voltage measurement circuitry during a plurality of conditions including while the engine is running at different speeds and/or different loads are applied to the battery and responsively provided a diagnostic output related to the charging system of the vehicle as a function of the measured voltage and as a function of the plurality of conditions at which the voltages are obtained.

2. The tester of claim 1 wherein the microprocessor further preforms a battery test and the diagnostic output is further a function of the battery test.

3. The charging system tester of claim 2 including an input adapted to receive a battery rating for use in the battery test.

4. The charging system tester of claim 3 wherein the battery rating is in accordance with a standard selected from the group of standards consisting of SAE, DIN, IEC, EN or JIS.

5. The charging system tester of claim 1 wherein the voltage measurement circuitry includes a DC voltage sensor adapted to measure a DC voltage of the battery and an AC voltage ripple detector adapted to measure an AC ripple voltage across the battery.

6. The charging system tester of claim 1 wherein the microprocessor measures a steady state battery voltage with the engine off, a battery voltage with the engine revved, a battery voltage with the engine idling and a load applied to the battery, a battery voltage with this engine revved and a load applied to the battery and responsively provides an output indicating a low charging voltage, no charging voltage, a normal charging voltage or a high charging voltage.

7. The charging system tester of claim 6 wherein a high charging voltage comprises a voltage which is more than about 2.5 volts above a steady state voltage.

8. The charging system tester of claim 6 wherein the load comprises an in-vehicle load of the vehicle electrical system.

9. The charging system tester of claim 2 wherein the microprocessor is further adapted to measure a starting voltage across the battery while a starting motor of the vehicle is actuated to start an engine of the vehicle.

10. The charging system tester of claim 9 wherein the diagnostic output is further a function of the starting voltage.

11. The charging system tester of claim 9 wherein the microprocessor provides an output indicating that the battery requires charge if the starting voltage is low and the battery test indicates that the battery is discharged.

12. The charging system tester of claim 9 wherein the microprocessor provides a cranking voltage low output indication if the starting voltage is low and the battery test indicates the battery is fully charged.

13. The charging system tester of claim 9 wherein the microprocessor provides a cranking voltage normal output if the starting voltage is normal and the battery test indicates the battery is fully charged.

14. The charging system tester of claim 2 wherein the microprocessor provides a replace battery output if the battery test indicates a bad cell in the battery.

15. The charging system tester of claim 2 including a display adapted to display a result of the battery test.

16. The charging system tester of claim 15 wherein the displayed result is a qualitative indication of battery condition.

17. The charging system tester of claim 2 wherein the battery test comprises a battery conductance based test.

18. The charging system tester of claim 17 wherein the battery test is based upon a battery parameter selected from the group of parameters consisting of battery resistance, battery impedance and battery admittance.

19. The charging system tester of claim 1 wherein the microprocessor is adapted to receive an input indicating that the vehicle contains a diesel engine and wherein the microprocessor waits for glow plugs of the diesel engine to warm up and charging to start.

20. The charging system tester of claim 1 wherein the battery test is further a function of a temperature input.

21. The charging system tester of claim 1 wherein the microprocessor measures an AC ripple voltage across the battery and responsively provides an output indicative of a failed diode in the charging system of the vehicle.

22. The charging system tester of claim 21 wherein an AC ripple voltage more than about 130 mV indicates a faulty diode or stator in the charging system.

23. The charging system tester of claim 1 including a display and wherein the microprocessor outputs a prompt on the display to instruct and operator to apply an in-vehicle load from the vehicle electrical system.

24. The charging system tester of claim 23 wherein the in-vehicle load comprises vehicle headlights.

25. The charging system tester of claim 23 including coupling of sufficient length to allow the operator to operate the vehicle while operating the charging system tester.

26. The charging system tester of claim 1 including a display and wherein the microprocessor outputs a prompt on the display to instruct an operator to rev an engine of the vehicle.

27. A method of testing a battery charging system in a vehicle of the type used to charge a vehicle battery, comprising:
    measuring voltages across the battery during a plurality of conditions including at differing engine speeds and with differing loads applied to the battery; and
    responsively diagnosing the charging system as a function of the measured voltages and the plurality of conditions at which the voltages were obtained.

28. The method of claim 27 including prompting an operator to rev an engine of the vehicle.

29. The method of claim 27 including providing an output if the voltage across the battery with the engine revved is less than or the same as a steady state voltage across the battery with the engine off.

30. The method of claim 27 including instructing an operator to apply a load to the battery to remove a surface charge.

31. The method of claim 30 wherein the load comprises vehicle headlights.

32. The method of claim 27 including providing a diagnostic output if a ripple voltage across the battery is greater than 130 mV.

33. The method of claim 27 including receiving an input indicating that the vehicle contains a diesel engine.

34. The method of claim 33 including providing a delay period during the test to allow glow plugs of the diesel engine to heat and charging to start.

35. The method of claim 27 including comparing a steady state voltage of the battery with the engine turned off and no load applied to a charging voltage across the battery with the engine revved and with a load applied to the battery.

36. The method of claim 35 including providing an output if the engine revved voltage is less than the steady state voltage.

37. The method of claim 27 including providing a high charging voltage indication if the voltage across the battery with the engine revved is greater than about 2.5 volts above steady state voltage.

38. The method of claim 27 including providing a low charging voltage indication if the voltage across the battery with the engine revved and a load applied to the battery is less than the voltage across the battery with the engine idling.

39. The method of claim 38 wherein the load comprises an in-vehicle load of an electrical system of the vehicle.

40. The method of claim 39 including prompting an operator to apply the in-vehicle load.

41. The method of claim 27 including performing a battery test on the vehicle battery and wherein the diagnosing step of diagnosing is further a function of the battery test.

42. The method of claim 41 wherein the step of performing a battery test comprises performing a conductance based test.

43. The method of claim 41 wherein the step of performing a battery test includes obtaining a rating of the battery.

44. The method of claim 43 wherein the rating is obtained through a user input.

45. The method of claim 43 wherein the rating is in accordance with a standard selected from the group of standards consisting of SAE, DIN, IEC, EN and JIS.

46. The method of claim 41 including measuring a starting voltage while an engine of the vehicle is started.

47. The method of claim 46 including providing a charge battery output if the starting voltage is low and the battery test indicates the battery is discharged.

48. The method of claim 46 including providing a cranking voltage low output if the starting voltage is low and the battery test indicates the battery is fully charged.

49. The method of claim 46 including providing a cranking voltage normal output if the starting voltage is within a normal range and the battery test indicates the battery is fully charged.

50. The method of claim 41 including providing a replace battery output in response to the battery test.

51. The method of claim 41 wherein the battery test is based on a parameter selected from the group of parameters consisting of battery resistance, battery impedance and battery conductance.

52. The method of claim 41 including displaying a qualitative result of the battery test.

53. A diagnostic device for testing an electrical system of a vehicle including a battery and an alternator configured to charge the battery, comprising:
    a first connection adapted to couple to a positive battery terminal;
    a second connection adapted to couple to a negative battery terminal;
    an AC ripple amplifier coupled to the first and second connections having an output related to an AC ripple voltage across the battery generated by the alternator in the vehicle electrical system; and
    a microprocessor operably coupled to the battery and the AC ripple amplifier, the microprocessor configured to provide an output related to an alternator failure as a function of the AC ripple amplifier output, a DC voltage of the battery and a battery test performed on the battery and further configured to provide an output related to a condition of the battery.

54. The diagnostic device of claim 53 wherein the battery test is a function of a parameter of the battery selected from the group of parameters consisting of battery resistance, battery impedance and battery admittance.

55. The diagnostic device of claim 53 including a display when the microprocessor prompts an operator to apply an in-vehicle load.

56. The diagnostic device of claim 55 including cabling of sufficient length to allow the operator to operate the vehicle while testing the electrical system of the vehicle.

57. The diagnostic device of claim 53 including a conductance amplifier coupled to the first and second connections having an output related to an internal conductance and wherein the condition output is a function of the conductance amplifier output.

58. The diagnostic device of claim 57 including a user input adapted to receive an input related to a rating of the battery in accordance with a standard and the microprocessor is configured to provide the battery condition output as a function of the rating and the conductance amplifier output.

59. The diagnostic device of claim 58 including a battery DC voltage measurement circuit coupled to the first and second connections adapted to measure a DC battery voltage and wherein the battery condition output is further a function of the DC battery voltage.

60. The diagnostic device of claim 58 wherein the standard is selected from the group of standards consisting of SAE, DIN, IEC, EN and JIS.

61. The diagnostic device of claim 53 wherein the microprocessor is further configured to test a starter of the vehicle electrical system.

62. The diagnostic device of claim 61 wherein the microprocessor provides a starter condition output as a function of the starter test and the battery test.

63. The diagnostic device of claim 61 wherein the microprocessor is configured to measure a starting voltage.

64. The diagnostic device of claim 63 wherein the microprocessor provides an output indicating that the battery requires charge if the starting voltage is low and the battery test indicates that the battery is discharged.

65. The diagnostic device of claim 63 wherein the microprocessor provides a cranking voltage low output indication if the starting voltage is low and the battery test indicates the battery is fully charged.

66. The diagnostic device of claim 53 wherein the condition output comprises battery CCA.

67. The diagnostic device of claim 53 including a display and wherein the microprocessor prompts an operator to rev an engine of the vehicle.

68. The diagnostic device of claim 53 wherein the microprocessor provides a cranking voltage normal output if the starting voltage is normal and the battery test indicates the battery is fully charged.

69. The diagnostic device of claim 53 wherein the microprocessor provides a replace battery output if the battery test indicates a bad cell in the battery.

70. The diagnostic device of claim 53 wherein an AC ripple voltage more than about 130 mV indicates a faulty diode or stator in the charging system.

71. The diagnostic device of claim 53 wherein the battery test is further a function of a temperature input.

72. The diagnostic device of claim 53 wherein the battery test is a function of conductance of the battery.

73. A method for testing an electrical system of a vehicle containing a battery, comprising:
measuring a battery cranking voltage during operation of a starter motor of the electrical system;
obtaining condition information related to a condition of the battery; and
providing a starter condition output related to a condition of the starter motor as a function of the measured battery cranking voltage and the obtained condition information of the battery.

74. The method of claim 73 including providing a charge battery output if the battery condition is discharged and the battery cranking voltage is low.

75. The method of claim 73 including providing a cranking voltage low output if the battery condition is fully charged and the cranking voltage is low.

76. The method of claim 73 including providing a cranking voltage normal output if the battery condition is fully charged and the cranking voltage is normal.

77. The method of claim 73 including providing a replace battery output if the battery condition is replace or bad cell.

78. The method of claim 73 including instructing an operator to operate the starter motor.

79. The method of claim 73 wherein obtaining condition information comprises performing battery test.

80. The method of claim 79 wherein performing a battery test includes measuring battery conductance.

81. The method of claim 79 wherein performing a battery test includes measuring battery resistance.

82. The method of claim 79 wherein performing a battery test includes measuring battery conductance includes performing a load test on the battery.

83. The method of claim 73 wherein obtaining condition information includes receiving a battery rating of the battery through a user input.

84. The method of claim 73 including measuring diode ripple of an alternator of the electrical system during operation of an engine of the vehicle.

85. The method of claim 73 including detecting operation of the starter motor by measuring a voltage drop in the electrical system.

86. The method of claim 73 including detecting starting of an engine of the vehicle by detecting a rise in a voltage of the electrical system.

87. The method of claim 73 including performing a charging system test after providing the starter condition output.

88. The method of claim 73 wherein the condition information is obtained using Kelvin connections.

89. The method of claim 73 wherein obtaining the battery condition includes measuring a parameter of the battery selected from the group of parameters consisting of battery resistance, battery conductance and battery admittance.

90. The method of claim 73 including testing a charging system of the electrical system.

91. The method of claim 90 including prompting an operator to rev an engine of the vehicle.

92. The method of claim 90 including prompting an operator to apply an in-vehicle load of the electrical system.

93. The method of claim 90 including:
measuring voltages across the battery at differing engine speeds and with differing loads applied to the battery; and
responsively diagnosing the charging system based upon the measured voltages.

94. The method of claim 93 including comparing a steady state voltage of the battery with the engine turned off and no load applied to a charging voltage across the battery with the engine revved and with a load applied to the battery.

95. The method of claim 90 including receiving an input indicating that the vehicle contains a diesel engine.

96. The method of claim 95 including providing a delay period during the test to allow glow plugs of the diesel engine to heat and charging to start.

97. The method of claim 90 wherein the charging system test is a function of battery condition.

98. The method of claim 73 including instructing an operator to apply a load to the battery to remove a surface charge.

99. The method of claim 73 including displaying a qualitative result of the battery test.

100. An apparatus for testing an electrical system of an automobile, comprising:
first and second Kelvin connections configured to couple to terminals of a battery of the electrical system; and
a microprocessor configured to operate in accordance with programming instructions in memory and operably coupled to the battery through the Kelvin connections, the microprocessor configured to provide a battery test result, the microprocessor further configured to measure a starting voltage related to a voltage of the electrical system during operation of a starter motor of the electrical system and responsively provide a starter motor condition output as a function of the battery test result and the measured starting voltage.

101. The apparatus of claim 100 including an analog to digital converter configured to measure the starting voltage.

102. The apparatus of claim 100 wherein the microprocessor provides a charge battery output if the battery condition is discharged and the battery cranking voltage is low.

103. The apparatus of claim 100 wherein the microprocessor provides a cranking voltage low output if the battery condition is fully charged and the starting voltage is low.

104. The apparatus of claim 100 wherein the microprocessor provides a cranking voltage normal output if the starting voltage is normal and the battery test indicates the battery is fully charged.

105. The apparatus of claim 100 wherein the microprocessor provides a prompt to an operator to operate the starter motor.

106. The apparatus of claim 100 wherein the battery condition is a function of battery conductance.

107. The apparatus of claim 100 wherein the battery condition is a function of battery resistance.

108. The apparatus of claim 100 wherein the battery condition is a function of a load test on the battery.

109. The apparatus of claim 100 including an input configured to receive a battery rating and wherein the battery test result is a function of the battery rating.

110. The apparatus of claim 100 wherein the microprocessor further monitors diode ripple voltage of an alternator of the electrical system.

111. The apparatus of claim 100 wherein the microprocessor detects operation of the engine of the automobile based upon an increase in a voltage of the electrical system.

112. The apparatus of claim 100 wherein the microprocessor detects operation of the starter motor based upon a voltage drop in the electrical system.

113. The apparatus of claim 100 wherein the battery condition is a function of a battery parameter selected from the group of parameters consisting of battery impedance and battery admittance.

114. The apparatus of claim 109 wherein the battery rating is in accordance with a standard selected from the group of standards consisting of SAE, DIN, IEC, EN and JIS.

115. The apparatus of claim 100 including a display adapted to display a result of the battery test.

116. The apparatus of claim 115 wherein the displayed result of the battery test is a qualitative result.

117. The apparatus of claim 100 wherein the displayed result of the battery test is battery cold cranking amps.

118. The apparatus of claim 100 wherein the vehicle includes an engine and the microprocessor measures a steady state battery voltage with the engine off, a battery voltage with the engine revved, a battery voltage with the engine idling and a load applied to the battery, a battery voltage with this engine revved and a load applied to the battery and responsively provides an output indicating a low charging voltage, no charging voltage, a normal charging voltage or a high charging voltage.

119. The apparatus of claim 100 including cabling of sufficient length to allow the operator to operate the vehicle while testing the electrical system of the vehicle.

120. The apparatus of claim 100 wherein the microprocessor measures a charging voltage and diagnoses a charging system of the electrical system as a function of the charging voltage.

121. The apparatus of claim 120 including a display and wherein the microprocessor prompts an operator to apply an in-vehicle load.

122. The apparatus of claim 120 including a display and wherein the microprocessor prompts an operator to rev the engine.

123. The apparatus of claim 100 wherein the battery condition is a function of a temperature input.

* * * * *

UNITED STATES PATENT AND TRADEMARK OFFICE
CERTIFICATE OF CORRECTION

PATENT NO. : 6,351,102 B1
DATED : February 26, 2002
INVENTOR(S) : Micheal E. Troy It is certified that error appears in the above-identified patent and that said Letters Patent is hereby corrected as shown below:

Column 6,
Line 41, replace "stead" with -- steady --.

Column 7,
Line 38, replace "preforms" with -- performs --.
Line 56, replace "this" with -- the --.

Column 8,
Line 46, replace "and" with -- an --.

Column 14,
Line 4, replace "this" with -- the --.

Signed and Sealed this

Nineteenth Day of November, 2002

Attest:

Attesting Officer

JAMES E. ROGAN
*Director of the United States Patent and Trademark Office*